United States Patent [19]

Eustice

[11] 4,446,059

[45] May 1, 1984

[54] CONDUCTOR COMPOSITIONS

[75] Inventor: Albert L. Eustice, Lewiston, N.Y.

[73] Assignee: E. I. Du Pont de Nemours & Co., Wilmington, Del.

[21] Appl. No.: 368,807

[22] Filed: Apr. 15, 1982

[51] Int. Cl.³ .............................................. H01B 1/06
[52] U.S. Cl. ..................................... 252/514; 252/512; 252/518; 428/432; 428/433; 428/434; 106/1.13; 106/1.14
[58] Field of Search ....................... 252/512, 514, 518; 106/1.13, 1.14, 1.18, 1.19; 428/427, 432, 433, 434; 427/125, 126.1, 126.2, 126.3, 126.5; 65/DIG. 4, 60 C, 60 D, 40, 60 B, 60 A, 60 R; 204/38 B; 501/17, 19, 21, 12

[56] References Cited

U.S. PATENT DOCUMENTS

| | | | |
|---|---|---|---|
| 3,640,764 | 2/1972 | Shevlin | 117/212 |
| 3,649,567 | 3/1972 | Short | 252/514 |
| 3,671,311 | 6/1972 | Tarnopol et al. | 117/211 |
| 3,703,445 | 11/1972 | Tarnopol et al. | 204/15 |
| 3,865,558 | 2/1975 | Roth et al. | 29/195 |
| 3,879,184 | 4/1975 | Hamilton et al. | 65/107 |
| 3,900,634 | 8/1975 | Plumat | 252/514 |
| 3,929,674 | 12/1975 | Patterson | 252/514 |
| 4,011,087 | 3/1977 | Short | 252/514 |
| 4,039,721 | 8/1977 | Weitze et al. | 252/514 |
| 4,070,517 | 1/1978 | Kazonierowicz | 252/513 |
| 4,369,063 | 1/1983 | McGowan | 252/514 |

Primary Examiner—Josephine Barr

[57] ABSTRACT

Conductor composition comprising an admixture of finely divided particles of (a) conductive metal, (b) inorganic binder and (c) a colorant which is a mixture of silver oxide and/or copper oxide or precursor thereof and $B_2O_3$.

10 Claims, No Drawings

CONDUCTOR COMPOSITIONS

FIELD OF THE INVENTION

The invention is related to thick film conductor compositions and particularly to thick film conductor compositions for use as automotive window defoggers.

BACKGROUND OF THE INVENTION

In recent years automobile manufacturers have offered as optional equipment rear windows which can be defrosted and/or defogged by use of an electrically conductive grid permanently attached to the window. In order to defrost quickly, the circuit must be capable of supplying large amounts of power from a low voltage power source, for example, 12 volts. Furthermore, the lines of the conductive grid must be sufficiently narrow in order to maintain visibility through the rear window.

Heretofore, the materials used for the preparation of window defogging grids have mostly been thick film silver conductors which are prepared from paste comprising finely divided silver powder particles and glass frit dispersed in an organic medium. In a typical application a paste containing by weight 70% silver powder, 5% glass frit and 25% organic medium is screen printed through a 180 Standard Mesh Screen onto a flat, unformed glass rear window. The printed composition is dried for at least 2 minutes at about 150° C. and the entire element is then fired in air for from 2 to 5 minutes at 650° C. After firing, the softened glass is shaped by pressing into a mold and then tempered by rapidly cooling. During the firing cycle the organic medium is removed by evaporation and pyrolysis. The glass and silver are sintered to form a continuous conductive path with the glass acting as binder.

The silver compositions currently used yield upon firing resistances of from 2 to 15 milliohms per square. The resistance requirements vary according to the size of the window and hence the conductive grid. Conductors for large window areas need more electrical current because they have more area to defrost and therefore have much lower resistance requirements. Thus, the larger rear window area is typical of full sized cars require as little as 2 milliohms per square resistance, whereas the relatively small rear window area which is typical of compact cars can utilize compositions having resistances of as high as 15 milliohms per square.

Because of the current trend toward smaller cars the automotive industry anticipates a decline in the need for very low resistance silver compositions (2 to 4 milliohms per square) and forecasts suggest that the future resistance requirements will be for compositions of from 3 to 8 milliohms per square.

Such resistance requirements for defoggers are easily met by noble metal conductors, particularly silver, which is currently the most widely used conductor material.

In the manufacture of automotive defoggers, an important criterion has been the appearance of the interface between the glass and conductor pattern—particularly color. By far the most predominant type of glass used in the manufacture of automotive windows is soda-lime glass made by the float glass process in which the molten soda-lime glass is cast upon a long pool of molten tin or tin alloy in a controlled atmosphere. This process produces a glass of nearly perfect flatness and excellent thickness uniformity without the necessity of grinding and polishing. A typical soda-lime glass is comprised by weight of 72.5% $SiO_2$, 15.9% $Na_2O$, 6.5% CaO, 3.0% MgO, 1.3% $Al_2O_3$, 0.3% $K_2O$ and 0.3% other oxides and impurities.

When silver is used as a conductive material, a naturally dark brown color is produced at the glass-conductor interface even without the addition of colorants when the conductor is printed on the "tin side" of the glass, i.e., on the side of the glass which was next to the tin in the float process. However, when the conductor is printed on the "air side" of the glass, i.e., on the side exposed to the atmosphere, no such color development takes place. The reason for this difference between the "air" and "tin" sides is not known with certainty but is believed to be due to insolubilization of silver at the interface by reaction with minute amounts of residual tin from the float process.

In the manufacturing process it is, however, preferred to print the conductor on the air side in order to avoid certain handling difficulties. For this reason formulations of thick film pastes for this use have contained various coloring agents so that they may be printed on the air side of the glass with suitable color development.

Heretofore the colorants for soda-lime glass have been silver salts such as $Ag_2SO_4$ and $Ag_2S$ which upon firing take part in ion exchange reactions with components of the glass substrate to form particles of silver at the interface between the substrate glass and the conductor composition printed thereon. These particles then form colored agglomerates. This phenomenon is believed to take place by the following sequence of reactions:

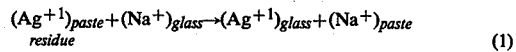  (1)

  (2)

It should be noted here that gold and copper act in the same manner as silver and therefore could be used in the same way as silver. However, they are not used for this purpose to any substantial extent.

In clear glass substrates, $Fe^{2+}$ ions are present in small amounts as an impurity while in tinted glass more substantial amounts are present as a coloring additive to the glass. Thus, the above-postulated sequence of reactions is possible whether or not iron is specifically added to the substrate.

It is usual in the manufacture of automotive windows having defogger circuits printed thereon to store them for a time in the outdoors after they have been fired and cooled. Often, after some prolonged period of storage, they are taken inside to a warm area where they are subject to condensation of atmospheric moisture thereon. It is has been found that condensation of this type is of sufficient magnitude that the sodium ions in the paste residue [See Equation (1)] react with sulfate or sulfide ions from the silver salt colorant; and, as the moisture evaporates a white residue is formed on the window, in areas near the printed conductor pattern. (If a copper salt colorant were used, the same phenomenon could take place by analogous reactions). Because of the unsightly nature of these deposits, manufacturers of automotive windows with defogger circuits printed therein have sought to overcome this. However, neither alternative colorants nor ways of suppressing the reactions have been forthcoming before now.

BRIEF DESCRIPTION OF THE INVENTION

The invention is therefore directed to thick film printable conductor pastes which can be used to print defogger circuits on the air-side of conventional soda-lime glass without incurring the formation of white residues on the printed defogger pattern. More particularly, the invention is directed to a conductive power composition comprising an admixture of finely divided particles of (a) 60-98.5% by weight conductive metal,
(b) 20-1.0% by weight inorganic binder, and
(c) 20-0.5% by weight colorant which is a mixture of 5-60% by weight of an oxide or oxide precursor of copper, silver or mixtures thereof, and 95-40% by weight of $B_2O_3$ or precursor thereof, the preferred colorant being comprised of no more than 40% by weight of the oxide of silver or 60% of the oxide of copper.

In a further aspect, the invention is directed to a screen-printable composition comprising the above-described conductive powder composition dispersed in an organic medium. In a still further aspect, the invention is directed to a conductive element comprising a nonconductive ceramic substrate having a conductive pattern affixed thereon by printing a pattern of the above-described dispersion and firing the printed substrate to effect volatilization of the organic medium and sintering of the inorganic binder, conductive metal, and the colorant.

DETAILED DESCRIPTION OF THE INVENTION

A. Conductive Metal

Suitable metals for the conductive phase of the composition of the invention include gold and copper as well as silver, the last of which is by far the most widely used and will, therefore, be the most important metal for this purpose.

The particle size of the conductive metal(s) is not narrowly critical from the standpoint of technical effectiveness in the invention. However, the conductive metal should, of course, be of a size appropriate to the manner in which it is to be applied, which is usually by screen printing, and to the firing conditions. Thus, the conductive phase metal particles should be no bigger than about 10 $\mu$m and preferably below about 5 $\mu$m. As a practical matter, the available particle size of the metals is as low as 0.1 $\mu$m.

The conductive phase metal particles will ordinarily be those having high purity (99+%) which are readily available on a commercial basis. However, materials of somewhat lesser purity can be used in most instances.

The amount of conductive phase components in the metallization, excluding any in the colorant, will ordinarily be from 60-98.5% of the metallization (excluding organic medium) and preferably 80-90% by weight.

B. Inorganic Binder

Glasses and other inorganic binders used in conductors perform several functions. The primary function of binders is to provide chemical or mechanical bonding to the substrate. They also may facilitate sintering of the metal film by means of liquid phase sintering when the glassy binder wets the conductor surface. It is preferred that the glass binder have a softening point below 600° C. in order that the glass have adequate fusion properties. These are needed for adhesion to the substrate and in some cases for protection of the conductive material.

Although the chemical composition of the binder system is not critical to the functionality of these thick film conductor compositions, the inorganic binder should melt or flow at a sufficiently low temperature partially to encapsulate the metal particles during sintering and hence reduce oxidation and improve hermeticity.

Lead borosilicate glasses have been used extensively in the invention and found to be excellent from the viewpoint of low softening point and good adhesion to the soda-lime glass substrate. However, in order to assure good hermeticity, it is preferred to use low borate glasses, that is, those containing below about 20% by weight $B_2O_3$ or equivalent. Both reducing and nonreducing glasses are operable.

The amount of organic binder will ordinarily be from 1 to 20% by weight of the metallization (excluding organic medium) and preferably 1 to 10% by weight.

Though many conventional glass frits may be used in the invention, e.g., both reducing and nonreducing glasses, it will be preferred to use those glasses which (1) have a softening point below 700° C., (2) exhibit superior adhesion to the substrate glass and (3) do not interfere with the color formation and (4) are not overly sensitive to moisture. A softening point below 600° C. is still further preferred. Particularly preferred frits for this use are the following:

|        | A    | B    |
|--------|------|------|
| PbO    | 78.1 | 80.5 |
| $B_2O_3$ | 12.4 | 12.0 |
| CdO    | —    | —    |
| $SiO_2$  | 5.4  | 6.0  |
| ZnO    | —    | 1.5  |
| $Al_2O_3$ | 4.1  | —    |

C. Colorant

The colorant component of the invention is an admixture of 5 to 60% by weight of an oxide or metal oxide precursor of copper, silver or mixtures thereof and 95-40% by weight of $B_2O_3$ or precursor thereof. However, the silver-containing material should not exceed 40% by weight of the total colorant and the copper-containing material should not exceed 60% by weight.

As indicated above, the oxides and silver and mixtures thereof will ordinarily be used as color components because they are usually the most economical form. However, other compounds such as carbonates, oxalates and esters, which will decompose under firing conditions to form the corresponding oxides, are suitable as well.

Either copper or silver oxide can be used to the exclusion of the other in combination with the $B_2O_3$. However, it is preferred to use mixtures of copper and silver in ratios by weight of from 0.1 to 10 and preferably from 1 to 3.

While the separate colorant components can be included in the metallization admixture, it is preferred to incorporate them as a frit. For example, a mixture of boric acid powder and metal oxide powder is heated to 800°-1050° C. for 15 to 30 minutes and then cast into cold water to produce a coarse frit. The coarse frit is then reduced in particle size by ball milling to a fine powder. By fritting the colorant, it is better assured that the colorant will be homogeneous and thus facilitate better mixing with the metallization during the firing.

Like the conductive phase, the particle size of the colorant components is not narrowly critical from the standpoint of their technical effectiveness in compositions of the invention. However, they should be of a size appropriate to the manner in which they are applied and fired.

Although the amount of colorant is not critical from the standpoint of electrical functionality, the colorant will ordinarily constitute 0.1 to 20% by weight of the metallization (excluding organic medium) and preferably 2 to 10% by weight.

In addition to the primary colorant, a small amount of dark inorganic pigment can be added to enhance the color of the fired composition. However, no more than about 5% by weight must be used to avoid significant changes in the functional properties of the metallization. Copper chromite has been found useful for this purpose. Other dark inorganic pigments can be used as well.

D. Organic Medium

The metallizations of the invention will ordinarily be formed into paste which is capable of being printed in a desired circuit pattern.

Any suitably inert liquid can be used as organic vehicle, nonaqueous inert liquids being preferred. Any one of various organic liquids with or without thickening agents, stabilizing agents and/or other common additives can be used. Exemplary of the organic liquids which can be used are alcohols, esters of such alcohols such as the acetates and propionates, terpenes such as pine oil, terpineol and the like, solutions of resins such as polymethacrylates or solutions of ethyl cellulose in solvents such as pine oil and mono-butyl ether of ethylene glycol mono-acetate. The vehicle can also contain volatile liquids to promote fast setting after printing to the substrate.

A preferred vehicle is based on a combination of a thickener consisting of ethyl cellulose in terpineol (ratio 1 to 9), combined with butyl carbitol acetate. The pastes are conveniently prepared on a three-roll mill. A preferred viscosity for these compositions is approximately 30–100 Pa.S measured on a Brookfield HBT viscometer using a #5 spindle at 10 rpm and 25° C. The amount of thickener utilized is determined by the final desired formulation viscosity, which, in turn, is determined by the printing requirement of the system.

E. Formulation

The weight ratio of functional (conductive) phase to binder phase which can be used in the invention varies from as low as 1.5 to as high as 50. It is feasible to operate at quite low functional/binder ratios without severely degrading resistivity properties. However, because the net effect of using lower ratios is to dilute the conductive phase with nonconductive glass, there is some increase in resistance. For this reason, it is preferred to use a functional/binder ratio of at least 10 and preferably 15. An optimum ratio has been found to lie at a weight ratio between 15 and 40.

The weight ratio of colorant to the functional phase or to the binder is not at all critical and is governed by the degree of color which is desired. Also, when a greater amount of metal oxide is used in the colorant, the color of the defogger circuit is more intense. Likewise the amount of organic medium is not critical and is determined by the rheological characteristics which are desired for applying the metallization to the substrate.

In addition to the above-described primary functional components, the defogger pastes of the invention can also contain small amounts of additives to modify the properties of the composition. For example, metal resinates can be added to change resistance and adhesion properties and pigments can be added to intensify colors. The total amounts of such materials ordinarily will not exceed about 5% by weight.

F. Application

The conductor composition of the invention can be printed onto a substrate using conventional screen-printing techniques. The substrate is generally soda-lime window glass, although any glass or ceramic can be used. The following procedure is used to produce defogger circuits in the laboratory:
1. The metallization dispersed in organic medium is screen printed onto a flat glass plate using a conventional screen, typically 200 mesh, although a wide range of mesh sizes can be used with equal success;
2. The printed pattern is dried at 150° C. for 15 minutes;
3. The glass plate is then fired for 7 minutes in a box furnace at 600°–700° C.; (At the higher temperatures the glass is sufficiently soft that it tends to bend. Therefore it may be necessary to support the glass.)
4. The glass is allowed to cool in air.

G. Test Procedures

1. Resistance

The resistance of a 640 or 800 square serpentine pattern with a width of 0.75 mm and a total length of 486 or 606 mm was measured using a 1702 ohmmeter manufactured by the Electro Scientific Instrument Company. The ohms per square were calculated by dividing the resistance by 640 or 800, respectively.

2. Lead Adhesion

Braided wire leads ¼ inch wide were soldered onto ¼×3 inch conductor patterns. Using a Chatillon Model UTSM tensile tester (John Chatillon and Sons, N.Y., N.Y.), the lead adhesion was determined in a 90° C. peel test at a crosshead speed on 1 inch per minute. Lead adhesion values greater than 10 pounds were preferred.

EXAMPLES

EXAMPLES 1–6

A series of 6 colorants was prepared in frit form in the manner described in section C above. The composition of the starting materials and the resultant frit are given in Table 1 below. Powder compositions are given in grams. Frit compositions are given in % wt. of the total colorant.

TABLE 1

| | Frit Colorant Composition | | | | | |
|---|---|---|---|---|---|---|
| | Powder Composition (gram) | | | Calculated Frit Composition (% wt.) | | |
| Ex. No | CuO | Ag$_2$CO$_3$ | H$_3$BO$_3$ | CuO | Ag$_2$O | B$_2$O$_3$ |
| 1 | 53.3 | — | 82.9 | 53.3 | — | 46.7 |
| 2 | — | 101.8 | 213.6 | — | 41.6* | 58.4 |
| 3 | 34.3 | 21.1 | 97.8 | 32.0 | 16.6 | 51.4 |
| 4 | 30.0 | 23.8 | 88.8 | 30.0 | 20.0 | 50.0 |
| 5 | 30.0 | 35.7 | 71.1 | 30.0 | 30.0* | 40.0 |

TABLE 1-continued

Frit Colorant Composition

| Ex. No | Powder Composition (gram) | | | Calculated Frit Composition (% wt.) | | |
|---|---|---|---|---|---|---|
| | CuO | $Ag_2CO_3$ | $H_3BO_3$ | CuO | $Ag_2O$ | $B_2O_3$ |
| 6 | 30.0 | 28.6 | 81.7 | 30.0 | 24.0 | 46.0 |

*Small portions of the silver carbonate in Examples 2 and 5 were reduced to metallic silver, thereby lowering the total silver oxide content below the calculated value. This occurrence did not interfere with the function of the frit as a colorant, however.

EXAMPLES 7–16

Each of the colorant frits prepared in Examples 1–6 was formulated into a defogger paste, using one of the preferred glasses described hereinabove by the procedure described in section D, above, and applied by screen printing to a soda-lime glass substrate as described in section F. Each of the compositions exhibited excellent adhesion and resistance properties and a brown color on the air side of the substrate.

TABLE 2

Defogger Paste Compositions - Resistance

| Ex. No. | Conductive Phase (Ag) | Frit Type | Amt. | Colorant Type | Amt. | Organic Medium | Other | Resistivity (mΩ/□) |
|---|---|---|---|---|---|---|---|---|
| 8  | 78.1 | B | 4.0  | 4     | 6.0      | 9.9   | 2.0  | 2.2 |
| 9  | 70.0 | B | 4.0  | ½     | 3.0/2.0  | 19.8  | 1.2  | 1.8 |
| 10 | 64.0 | B | 2.0  | 3     | 6.0      | 26.05 | 1.95 | 4.4 |
| 11 | 60.0 | B | 1.75 | 3     | 8.0      | 29.25 | 1.0  | 4.8 |
| 12 | 60.0 | A | 3.50 | 3     | 5.0      | 30.50 | 1.0  | 4.5 |
| 13 | 70.0 | B | 3.0  | 4     | 6.0      | 19.15 | 1.85 | 2.8 |
| 14 | 60.0 | B | 7.0  | 3     | 5.0      | 27.00 | 1.0  | 4.4 |
| 15 | 60.0 | B | 3.5  | 5     | 8.0      | 27.50 | 1.0  | 4.9 |
| 16 | 67.0 | B | 1.8  | 4     | 4.5      | 25.45 | 1.25 | 3.5 |

EXAMPLES 17–20

In the foregoing examples, a small amount of copper chromite (black) pigment was used to intensify the color of the fired defogger pattern. While such technique may be aesthetically desirable, it is by no means necessary, which can be seen by the following direct comparison of two pastes which were identical in all essential respects except that one contained no pigment. The formulation and application procedures were the same as in the preceding examples.

TABLE 3

Defogger Paste Compositions - Fired Color

| Ex. No. | Conductive Phase (Ag) | Frit Type | Amt. | Colorant Type | Amt. | Organic Medium | Copper Chromite | Resistivity (mΩ/□) | 640° C. Fired Color |
|---|---|---|---|---|---|---|---|---|---|
| 17 | 65 | (B) | 2.0 | 6 | 6.0 | 25.5 | 1.50 | 4.6 | Dk. Brn. |
| 18 | 65 | (B) | 2.0 | 6 | 6.0 | 27.0 | —    | 4.5 | Med. Tan |
| 19 | 65 | (B) | 2.0 | — | —   | 31.5 | 1.50 | 4.1 | V. Light Tan |
| 20 | 65 | (B) | 2.0 | — | —   | 33.0 | —    | 3.4 | yellow |

An even color was obtained in each test, the composition containing the colorant and pigment being the darkest.

I claim:

1. A metallization for printing conductor patterns upon a soda lime glass substrate comprising an admixture of finely divided particles of
   (1) 60 to 98.5% wt. conductive metal selected from the group consisting of Ag, Au, Cu and alloys and mixtures thereof,
   (2) 20 to 1% wt. inorganic binder, and
   (3) 20 to 0.5% wt. of a colorant which is a mixture of 5 to 60% wt. of an oxide of or a precursor of an oxide of copper, silver or mixtures thereof and 95 to 40% wt. of $B_2O_3$ or precursor thereof, the colorant being comprised of no more than 40% wt. of oxide of silver or 60% wt. of oxide of copper.
2. The metallization of claim 1 which is comprised of
   (1) 80 to 97% wt. conductive metal,
   (2) 10 to 1% wt. inorganic binder, and
   (3) 10 to 2% wt. of a colorant.
3. The metallization of claim 1 which the weight ratio of conductive metal to inorganic binder is from 15 to 40.
4. The metallization of claim 1 in which the inorganic binder is a lead borosilicate glass.
5. The metallization of claim 1 in which the colorant is comprised of a powdered frit of metal oxide and $B_2O_3$.
6. The metallization of claim 1 which contains 0 to 5% wt. inorganic pigment.
7. A screen-printable paste composition comprising the metallization of claim 1 dispersed in an organic medium.
8. A conductive element comprising a soda lime glass substrate having a conductive pattern affixed thereon by printing a pattern of the composition of claim 1 and firing the printed substrate to effect volatilization of the organic medium and sintering of the inorganic binder, conductive phase and colorant.
9. The element of claim 8 in which the substrate is automotive glass.
10. The element of claim 9 in which the automotive glass is printed with a pattern suitable for use as a defogger.

* * * * *